United States Patent
Minesaki

(10) Patent No.: US 7,827,512 B2
(45) Date of Patent: Nov. 2, 2010

(54) SEMICONDUCTOR DEVICE AND METHOD OF DESIGNING THE SAME

(75) Inventor: Fujiyuki Minesaki, Miyazaki (JP)

(73) Assignee: Oki Semiconductor Co., Ltd. (JP)

( * ) Notice: Subject to any disclaimer, the term of this patent is extended or adjusted under 35 U.S.C. 154(b) by 465 days.

(21) Appl. No.: 11/822,585

(22) Filed: Jul. 9, 2007

(65) Prior Publication Data
US 2008/0055806 A1    Mar. 6, 2008

(30) Foreign Application Priority Data
Aug. 30, 2006   (JP)   ............................. 2006-233209

(51) Int. Cl.
  G06F 17/50   (2006.01)
  G11B 5/127   (2006.01)
  G11C 5/14    (2006.01)
(52) U.S. Cl. ................. 716/10; 716/1; 716/2; 716/8; 716/11; 716/14; 360/323; 365/226
(58) Field of Classification Search ............. 716/10, 716/11; 365/226; 360/323
See application file for complete search history.

(56) References Cited

U.S. PATENT DOCUMENTS

| | | | |
|---|---|---|---|
| 6,479,869 B1 * | 11/2002 | Hiraga ........................ | 257/350 |
| 6,535,368 B2 * | 3/2003 | Andresen et al. ............. | 361/56 |
| 6,920,026 B2 * | 7/2005 | Chen et al. .................... | 361/56 |
| 7,312,517 B2 * | 12/2007 | Hirata ......................... | 257/678 |
| 2006/0187733 A1 * | 8/2006 | Furuta et al. ................ | 365/226 |
| 2008/0313591 A1 * | 12/2008 | Watanabe .................... | 716/10 |

FOREIGN PATENT DOCUMENTS

| JP | 2000-208718 | 7/2000 |
|---|---|---|
| JP | 2004-146524 | 5/2004 |

* cited by examiner

*Primary Examiner*—Helen Rossoshek
(74) *Attorney, Agent, or Firm*—Studebaker & Brackett PC; Donald R. Studebaker

(57) ABSTRACT

A plurality of internal circuits (11 to 14) are formed on a semiconductor chip 10, and receive different power supply voltages. An ESD protection circuit (15) is connected to the power supply lines (31 to 34) for the internal circuits (11 to 14). The area in which the protection circuit (15) is formed is closer to the center of the semiconductor chip (10) than the areas for the internal circuits (11 to 14). Surge voltages applied to the power supply pads reach the protection circuit before reaching the reaching the internal circuits.

4 Claims, 6 Drawing Sheets

SEMICONDUCTOR DEVICE AND METHOD OF DESIGNING THE SAME

BACKGROUND OF THE INVENTION

The present invention relates to a semiconductor device and a method of designing it, and in particular to a semiconductor device comprising a plurality of internal circuits formed on a semiconductor chip, and supplied with different power supply voltages, and a protection circuit for protecting the internal circuits from an electrostatic discharge (ESD), and a method of designing such a semiconductor device.

Examples of the internal circuits formed on the same semiconductor chip, and supplied with different power supply voltages include a regulator circuit, a digital logic circuit, and an analog circuit. The power supply voltage for such internal circuits is generally supplied from outside of the chip, via power supply pads on the chip, to the power supply lines for the internal circuits, and the power supply pads are generally disposed in the peripheral part of the chip.

It is desirable that a protection circuit is positioned between the power supply pads and the internal circuits such that the surge voltage applied to the power supply pads at the time of ESD occurrence reaches the protection circuit before it reaches the internal circuits. Where a plurality of internal circuits receiving different power supply voltages are provided, it is desirable that separate protection elements are provided for protection against an excessive voltage between each power supply line for each internal circuit and the associated ground line, for protection against an excessive voltage between the power supply lines for the different internal circuits, and for protection against an excessive voltage between the ground lines for the different internal circuits.

Where a plurality of different protection circuits are provided, it is not possible to place all the protection circuits between the power supply pads and the internal circuits, and the surge voltage applied to the power supply pads may reach the internal circuits before reaching the protection circuits, and it may not be possible to provide a sufficient protection for the internal circuits.

Japanese Patent Kokai Publication No. 2000-208718 shows an arrangement in which protection is made for circuits receiving power supply voltages different from each other, and protection elements are disposed in an area closest to the power supply systems. Specifically, part of the protection elements are provided in the central area.

However, in the device shown in Japanese Patent Kokai Publication No. 2000-208718, the protection elements positioned in the central area are not necessarily positioned between the power supply pads and the internal circuits, and it was not possible to securely protect the internal circuits from the ESD surge voltages.

SUMMARY OF THE INVENTION

According to the invention, there is provided a semiconductor device comprising:

a plurality of internal circuits formed on a semiconductor chip and receiving a plurality of different power supply voltages; and a protection circuit for ESD protection, formed on said semiconductor chip, and connected to the power supply lines for said internal circuits;

wherein the area in which said protection circuit is formed is positioned closer to the center of the semiconductor chip than the areas in which said internal circuits are formed; and said power supply lines are provided to extend from power supply pads via said protection circuit and to the said internal circuits.

According to the invention, the protection circuit is positioned to be between all the internal circuits and the power supply pads, so that it is possible to protect the internal circuit from the ESD surge voltages without fail, and it is possible to shorten the power supply lines for conveying the power supply voltages.

DETAILED DESCRIPTION OF THE PREFERRED EMBODIMENTS

Embodiment 1

Figure 1:
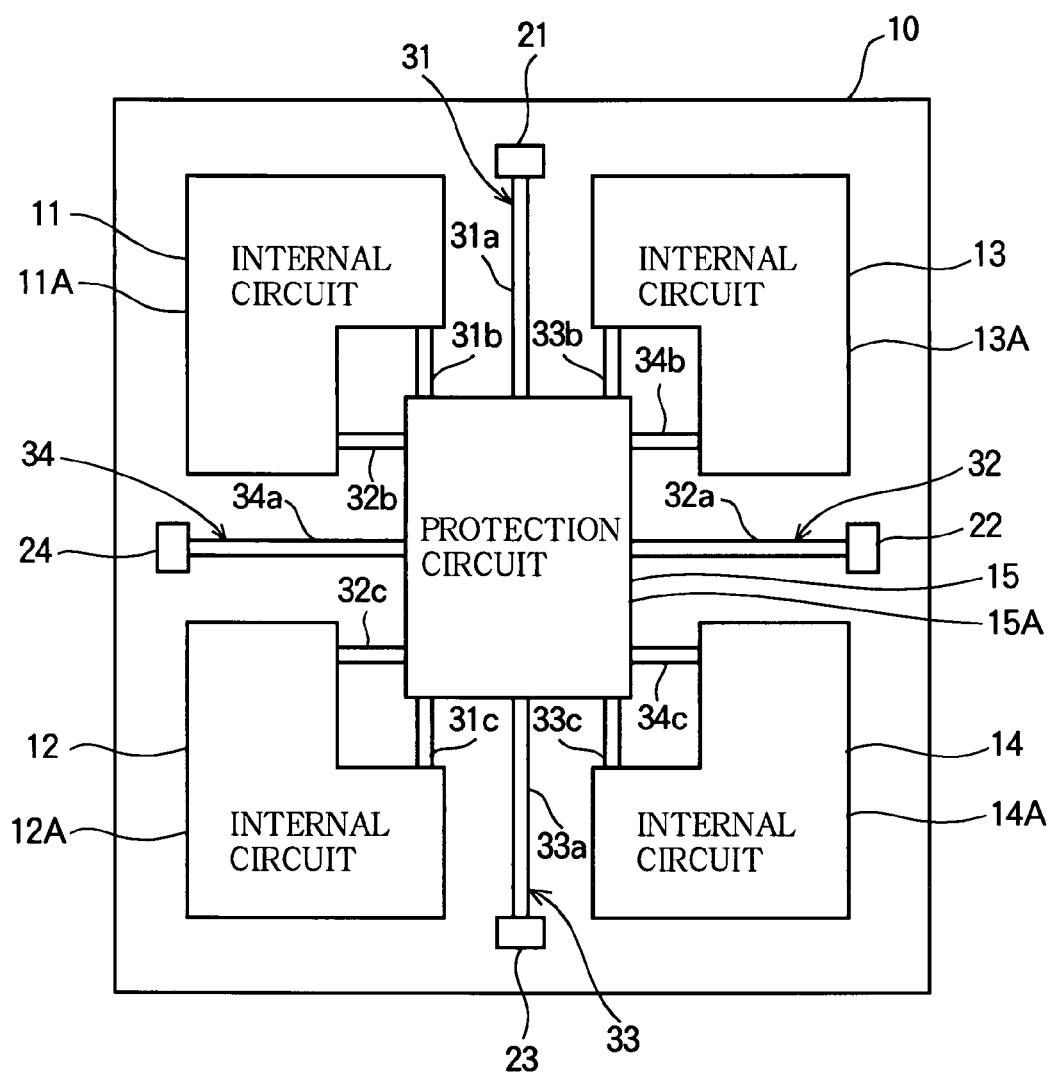
FIG. 1 is a drawing showing the arrangement of the internal circuits and the protection circuit on a main surface of a semiconductor device according to Embodiment 1 of the present invention.
Figure 2:
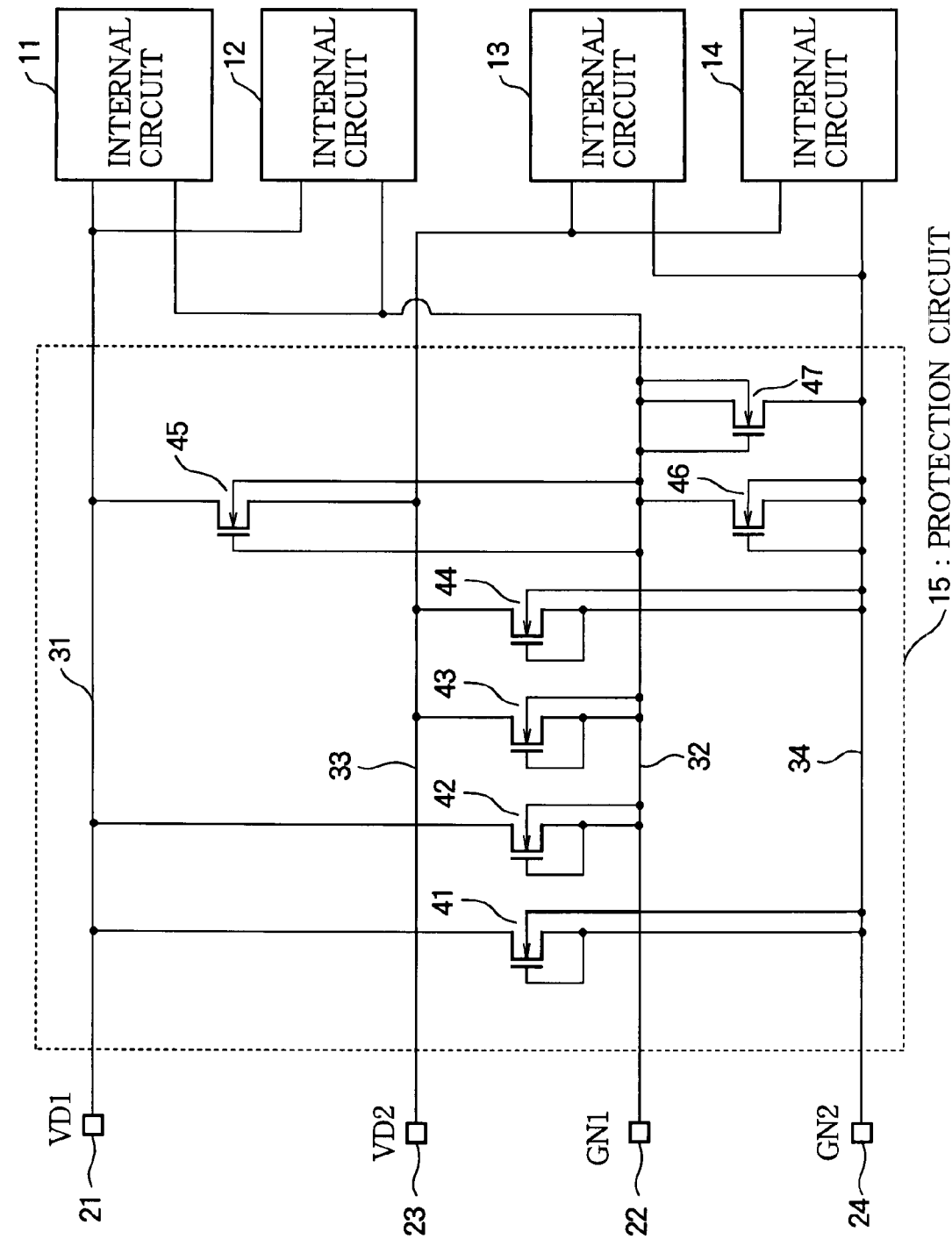
FIG. 2 is a circuit diagram showing the electrical connection of the protection circuit of the semiconductor device shown in FIG. 1.

FIG. 1 shows disposition or arrangement on the main surface of the semiconductor device of Embodiment 1, and FIG. 2 is a circuit diagram showing the electrical connection of the protection circuit in the semiconductor device of FIG. 1.

As shown in FIG. 1, the semiconductor device of Embodiment 1 comprises a plurality of, e.g., first to fourth internal circuits 11 to 14 formed on the main surface of a semiconductor chip 10, and a protection circuit 15 formed on the same semiconductor chip 10. In other words, the internal circuits are divided into four blocks 11 to 14.

The internal circuits 11 to 14 are supplied with different power supply voltages. In the illustrated example shown in FIG. 2, the first internal circuit 11 and second internal circuit 12 receive a first pair of power supply voltage VD1 and GN1, supplied to the power supply pads 21 and 22, i.e., a first high-potential side power supply voltage VD1, and a first low-potential side (ground-side) power supply voltage GN1, respectively via the power supply lines 31 and 32, while the third internal circuit 13 and the fourth internal circuit 14 receive a second pair of power supply voltages VD2 and GN2, supplied to the power supply pads 23 and 24, i.e., a second high-potential side power supply voltage VD2 and a second low-potential side (ground-side) power supply voltage GN2, respectively via power supply lines 33 and 34.

The first power supply voltage VD1 and the second power supply voltage VD2 are different from each other, and for example the first power supply voltage VD1 is higher than the second power supply voltage VD2.

The protection circuit 15 is connected to the power supply lines 31 to 34 of the internal circuits 11 to 14, and protects the internal circuits 11 to 14 from ESD.

As shown in FIG. 1, in the present embodiment, the protection circuit 15 is disposed in the center on the main surface of the semiconductor chip, and the internal circuits 11 to 14 are disposed around the protection circuit 15. That is, the area 15A (shown by the same rectangular lines as the protection circuit 15) in which the protection circuit 15 is formed is situated closer to the center of the main surface of the semiconductor chip 10, than the areas 11A to 11A (respectively shown by the same rectangular lines as the internal circuits 11 to 14) in which the internal circuits 11 to 14 are formed. In other words, the plurality of internal circuits 11 to 14 are formed in areas 11A and 13A situated at one side, in a first direction (e.g., the vertical direction in the drawing), of the area 15A in which the protection circuit 15 is formed, and in areas 12A and 14A situated at the other side, in the first direction, of the area 15A, and also in areas 11A and 12A situated at one side, in a second direction (e.g., the horizontal direction in the drawing) orthogonal to the first direction, of the area 15A, and in areas 13A and 14A situated at the other side, in the second direction, of the area 15A.

Stated differently, the area 15A in which the protection circuit 15 is formed is positioned between the areas 11A to 14A in which the internal circuits 11 to 14 are formed. More specifically, the areas 11A to 14A in which the plurality of internal circuits 11 to 14 are formed, are at positions different from each other in a first direction (e.g., the vertical direction in the drawing) on the main surface of the semiconductor chip 10, and at positions different from each other in a second direction (e.g., the horizontal direction in the drawing) orthogonal to the first direction on the main surface of the semiconductor chip 10, the area 15A in which the protection circuit 15 is formed is positioned between the plurality of internal circuits 11 to 14 in said first direction, i.e., between the areas 11A, 13A, and the areas 12A and 14A, and is also positioned between the plurality of internal circuits 11 to 14 in said second direction, i.e., between the areas 11A, 12A, and the areas 13A, 14A, In the embodiment shown in FIG. 1, the power supply pads 21 to 24 are provided in the peripheral parts of the main surface of the semiconductor chip 10, and the power supply pads 21 to 24 and the protection circuit 15 are connected by power supply lines 31 to 34 formed on the semiconductor chip 10.

As shown for example in FIG. 2, the protection circuit 15 may be formed of protection elements in the form of n-channel MOSFETs (which may hereinafter be referred to simply as "transistors") 41 to 47, connected between the power supply lines.

Among the transistors forming the protection circuit 15, the transistor 41 is for protection against the surge voltage applied across the power supply pads 21 and 24, and its drain is connected to the power supply line 31 connected to that one (21) of the power supply pads 21 and 24 which is supplied with a higher potential (as the power supply voltage during normal operation), and its source and gate and the substrate are connected to the power supply line 34 connected to that one (24) of the power supply pads 21 and 24 which is supplied with a lower potential (as the power supply voltage during normal operation). Thus, the protection element in the form of the transistor 41 has its one end (drain) connected to the power supply line 31, and the other end (source) connected to the power supply line 34.

Similarly, the transistor 42 is for protection against the surge voltage applied across the power supply pads 21 and 22, and has its drain connected to the power supply line 31 connected to that one (21) of the power supply pads 21 and 22 which is supplied with a higher potential, and its source, gate and substrate connected to the power supply line 32 connected to that one (22) of the power supply pads 21 and 22 which is supplied with a lower potential.

Similarly, the transistor 43 is for protection against the surge voltage applied across the power supply pads 23 and 22, and has its drain connected to the power supply line 33 connected to that one (23) of the power supply pads 23 and 22 which is supplied with a higher potential, and its source, gate and substrate connected to the power supply line 32 connected to that one (22) of the power supply pads 23 and 22 which is supplied with a lower potential.

Similarly, the transistor 44 is for protection against the surge voltage applied across the power supply pads 23 and 24, and has its drain connected to the power supply line 33 connected to that one (23) of the power supply pads 23, 24 which is supplied with a higher potential, and its source, gate and substrate connected to the power supply line 34 connected to that one (24) of the power supply pads 23 and 24 which is supplied with a lower potential.

Similarly, the transistor 45 is for protection against the surge voltage applied across the power supply pads 21 and 23, and has its drain connected to the power supply line 31 connected to that one (21) of the power supply pads 21 and 23 which is provided with a higher potential, its source connected to the power supply line 33 connected to that one (23) of the power supply pads 21 and 23 which is provided with a lower potential, and its gate and substrate connected to the power supply line connected to one of the ground-side power supply pads, e.g., the power supply line 32 connected to the power supply pad 22, as illustrated.

The transistors 46 and 47 are for protection against the surge voltage applied across the power supply pads 22 and 24. The drain of the transistor 46 is connected to the power supply line 32 connected to one, i.e., a first one (22) of the power supply pads 22 and 24, while the source, gate and substrate of the transistor 46 are connected to the power supply line 34 connected to the other, i.e., a second one (24) of the power supply pads 22 and 24. The drain of the transistor 47 is connected to the power supply line 34 connected to the second one (24) of the power supply pads 22 and 24, while the source, gate and substrate of the transistor 47 are connected to the power supply line 32 connected to the first one (22) of the power supply pads 22 and 24.

Figure 3:
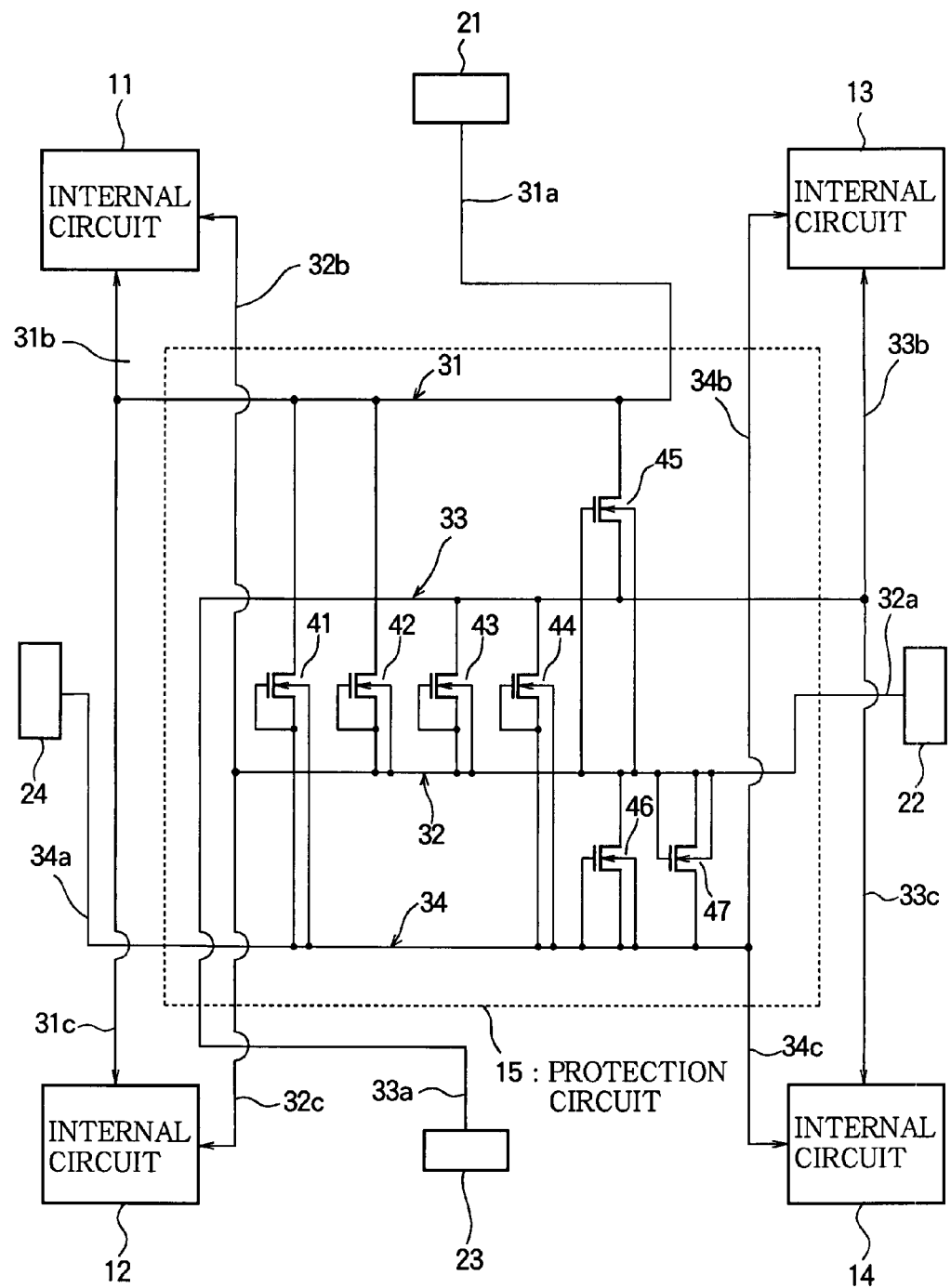
FIG. 3 is a drawing showing an example of arrangement of the power supply lines in the semiconductor device of Embodiment 1.

As shown in FIG. 2 and FIG. 3, the protection circuit 15 is positioned between the power supply pads 21 to 24, and the internal circuits 11 to 14, and the voltages applied to the power supply pads 21 to 24 are supplied via first parts 31a to 34a of the power supply lines 31 to 34 to the protection circuit 15, and then via second parts 31b to 34b, 31c to 34c of the power supply lines 31 to 34, to the internal circuits 11 to 14. In other words, the power supply lines 31 to 34 are provided or arranged to extend such that the voltages applied to the power supply pads 21 to 24, reach the protection circuit 15 before reaching the internal circuits 11 to 14. An example of arrangement of the power supply lines is shown schematically in FIG. 3.

In the example shown in FIG. 3, the points at which both ends of each of the protection elements 41 to 47 are connected with the power supply lines 31 to 34 are positioned between the power supply pads 21 to 24 and the internal circuits 11 to 14.

More specifically, the points at which respective ends (both ends) of the protection element 42 for protection against the surge voltage across the power supply pads 21 and 22 connected to the power supply lines 31 and 32 for supplying the power supply voltages to the internal circuit 11 and 12, are connected with the power supply lines 31 and 32, are positioned between the power supply pads 21, 22, and the internal circuits 11, 12. Moreover, the points at which the respective ends (both ends) of each of the protection elements 45, 41 for protection against the surge voltage across the power supply pad 21 connected to the power supply line 31 (for the internal circuits 11, 12), and the power supply pads 23, 24 connected to other power supply lines 33, 34 (for different internal circuits 13, 14), are positioned between the power supply pads 21, 23, 24, and the internal circuits 11 to 14. Furthermore, the points at which the respective ends (both ends) of each of the protection elements 43, 46, 47 for protection against surge voltages across the power supply pad 22 connected to the power supply line 32 (for the internal circuits 11, 12), and the power supply pads 23, 24 connected to the other power supply lines 33, 34 (for the different internal circuits 13, 14), are connected with the power supply lines 32, 33, 34, are positioned between the power supply pads 22, 23, 24, and the internal circuits 11 to 14.

Similarly, the points at which the respective ends (both ends) of the protection element 44 for protection against the surge voltage across the power supply pads 23 and 24 connected to the power supply lines 33 and 34 for supplying the power supply voltages to the internal circuits 13, 14, are connected with the power supply lines 33, 34, are positioned between the power supply pads 23, 24, and the internal circuits 13, 14. Moreover, the points at which the respective ends (both ends) of each of the protection elements 45, 43 for protection against surge voltages across the power supply pad 23 connected to the power supply line 33 (for the internal circuits 13, 14), and the power supply pads 21, 22 connected to other power supply lines 31, 32 (for the different internal circuits 11, 12) are connected with the power supply lines 33, 31, 32, are positioned between the power supply pads 23, 21, 22, and the internal circuits 11 to 14. Furthermore, the points at which the respective ends (both ends) of each of the protections elements 41, 46, 47 for protection against surge voltages across the power supply pad 24 connected to the power supply line 34 (for the internal circuits 13, 14), and the power supply pads 21, 22 connected to the other power supply lines 31, 32 (for the different internal circuits 11, 12), are positioned between the power supply pads 24, 21, 22, and the internal circuits 11 to 14.

Because the power supply lines 31 to 34 are formed as described above, surge voltages applied to the power supply pads 31 to 34 reach the protection transistors 41 to 47 before reaching the internal circuits 11 to 14, and absorbed by the protection transistors 41 to 47, so that the internal circuits 11 to 14 can be securely protected.

Moreover, because the protection circuit 15 is positioned in the center of the main surface of the semiconductor chip 10, the distances between the protection circuit 10 and the internal circuits 11 to 14 positioned around the protection circuit 15 do not have a large difference between them, so that the total length of the power supply lines 31 to 34 can be made relatively short (compared with a situation in which the protection circuit 15 is positioned in the area other than the center).

The layout of the above-described semiconductor device can be designed in the following manner.

First, the central area of the main surface of the semiconductor chip 10 is allocated to the area 15A for the protection circuit 15.

Next, areas in the peripheral parts of the main surface of the semiconductor chip 10 are allocated to the areas for the power supply pads 21 to 24.

Next, the areas remaining between the areas for protection circuit 15 and the areas for the power supply pads 21 to 24 are allocated to the areas for the areas for the power supply lines 31 to 34 connecting the protection circuit 15 and the power supply pads 21 to 24.

Next, areas remaining (i.e., remaining after the allocation to the area 15A, the areas for the power supply pads 21 to 24, and the areas for the power supply lines 31 to 34), are allocated to the areas 11A to 14A for the internal circuits 11 to 14.

The position of the area 15A for the protection circuit 15 may be adjusted depending on the sizes of the areas 11A to 14A for the internal circuits 11 to 14. For instance, if one of the internal circuits 11 to 14 requires a larger area, and other require less areas, then the area 15A for the protection circuit 15 may be shifted towards the internal circuits requiring smaller areas.

If the power supply pads 21 to 24 and the power supply lines 31 to 34 are formed above an insulating film, they may be provided over (in superposition on) those parts of the internal circuits 11 to 14 and the protection circuit 15 which are formed below the insulating film.

Embodiment 2

Figure 4:
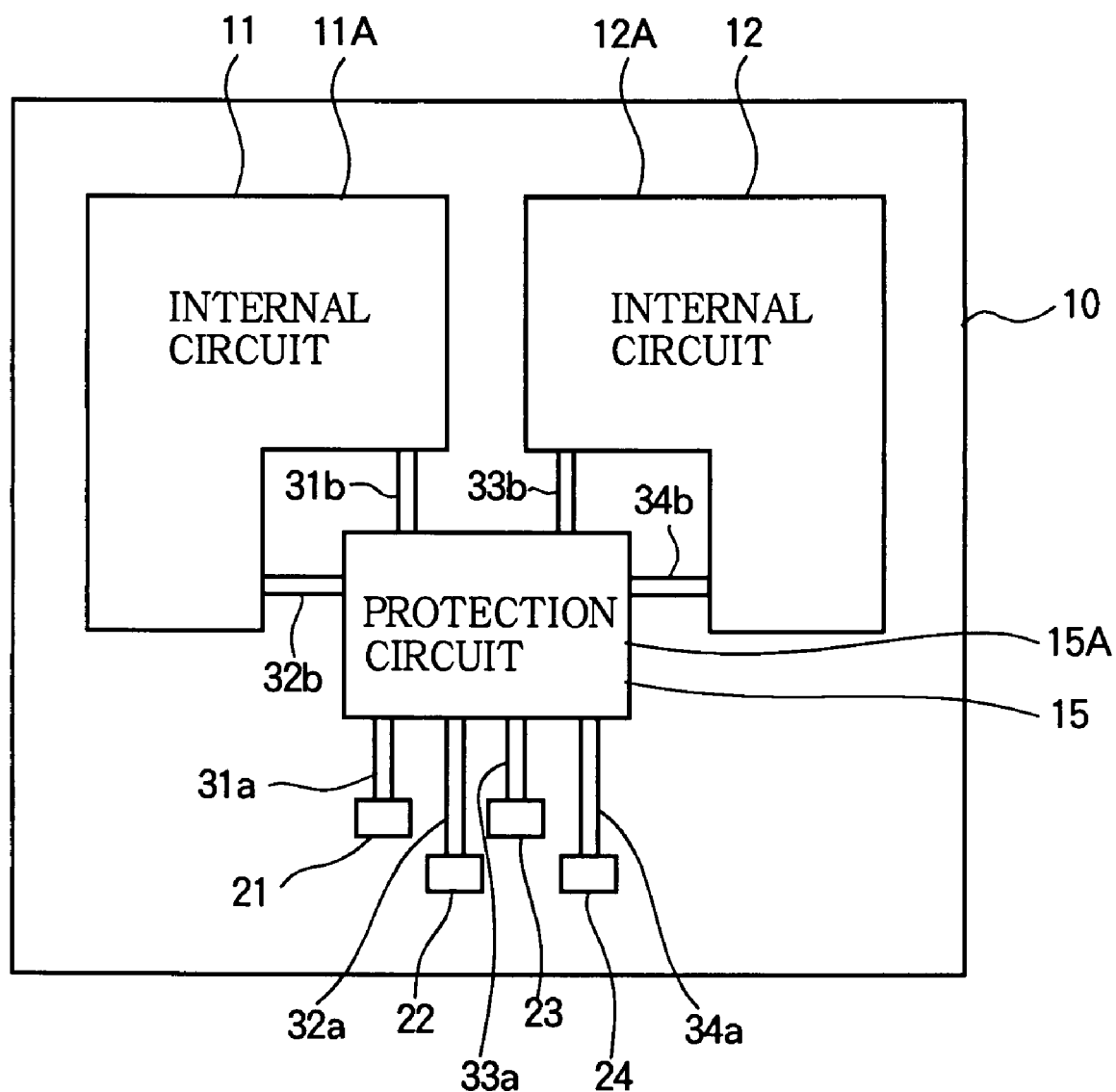
FIG. 4 is a drawing showing the arrangement of the internal circuits and the protection circuit on a main surface of a semiconductor device according to Embodiment 2 of the present invention.

In Embodiment 1, the internal circuits are formed in four blocks, and respectively called internal circuits 11 to 14, and are disposed in four areas 11A to 14A. The invention is not limited to such specific number of areas or blocks. In the example shown in FIG. 4, two internal circuits 11, 12 are formed in two areas 11A and 12A, and the protection circuit 15 is formed in the area 15A between the areas 11A and 12A.

In other words, two areas 11A and 12A in which two internal circuits 11 and 12 are formed in different positions in one direction (horizontal direction in FIG. 4), and the area 15A in which the protection circuit 15 is formed is positioned between the areas 11A and 12A in said one direction (horizontal direction), and in or around the center in said one direction (horizontal direction).

Embodiment 3

Figure 5:
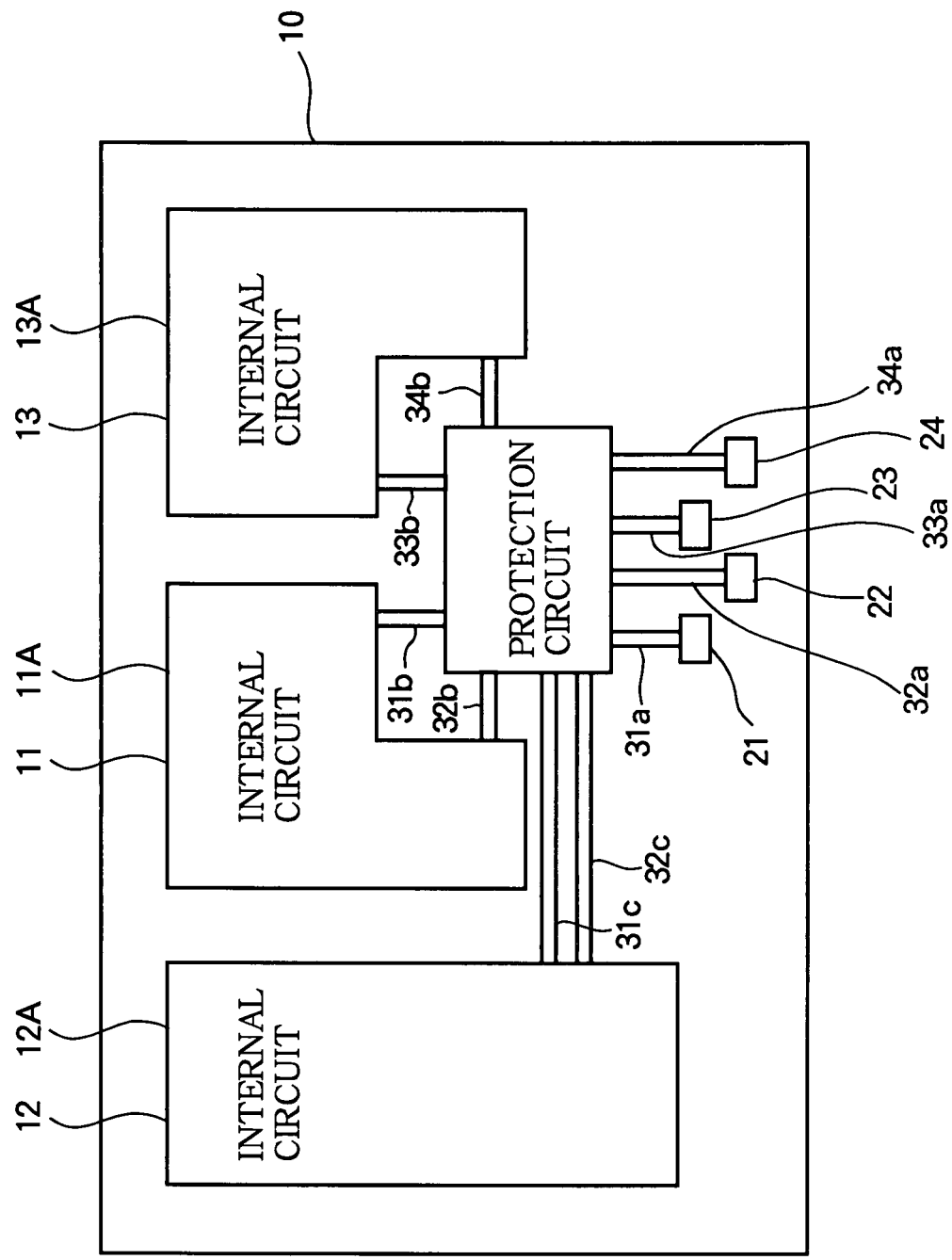
FIG. 5 is a drawing showing the arrangement of the internal circuits and the protection circuit on a main surface of a semiconductor device according to Embodiment 3 of the present invention.

In Embodiment 2, the internal circuits are at different positions in one direction (horizontal direction in FIG. 4) of the semiconductor chip, and the area in which the protection circuit is formed is positioned in the center in said one direction (horizontal direction). The invention is not limited to such an arrangement. In the example shown in FIG. 5, the sum of the areas 11A, 12A for the internal circuits 11, 12 positioned on one side (left side in the drawing) of the area 15A in which the protection circuit 15 is formed is relatively large, while the area 13A for the internal circuit 13 positioned on the other side (right side in the drawing) of the area 15A in which the protection circuit 15 is formed is relatively small.

However, by positioning the protection circuit 15 between the areas for the internal circuits, i.e., between the areas 11A, 12A, and the area 13A, as illustrated, the distances from the protection circuit 15 to the internal circuits 11, 12, 13, can be made shorter (e.g., the sum of the distances can be made shorter) than if the protection circuit 15 is positioned at other position, e.g., at an end of the chip.

Embodiment 4

Figure 6:
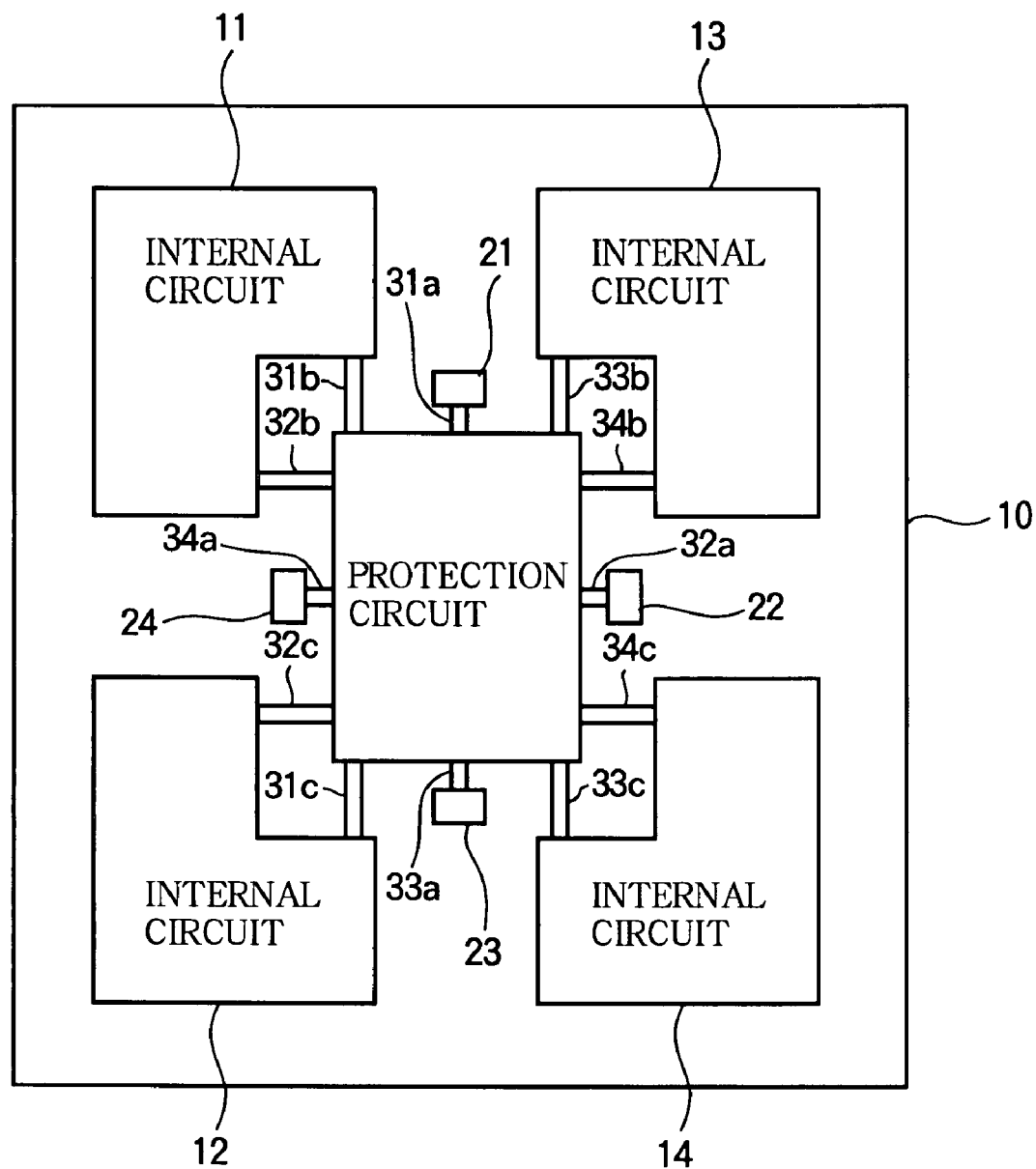
FIG. 6 is a drawing showing the arrangement of the internal circuits and the protection circuit on a main surface of a semiconductor device according to Embodiment 4 of the present invention.

In Embodiment 1, the power supply pads 21 to 24 are positioned in the peripheral parts of the semiconductor chip 10, but the invention is not limited to such an arrangement. In the example shown in FIG. 6, the power supply pads 21 to 24 are provided in the vicinity of the protection circuit 15. With such an arrangement, the distances from the power supply pads 21 to 24 to the protection circuit 15 can be made shorter, and the protection can be accomplished more securely.

What is claimed is:

1. A semiconductor device comprising:
   a plurality of internal circuits formed on a semiconductor chip and receiving a plurality of different power supply voltages, said plurality of internal circuits being disposed at positions different along a first direction and also at positions different along a second direction perpendicular to said first direction; and
   a protection circuit for ESD protection formed on said semiconductor chip and connected to the power supply lines for said internal circuits;
   wherein said protection circuit is disposed between said plurality of internal circuits in said first direction and also between said plurality of internal circuits in said second direction; and
   said power supply lines are provided to extend from power supply pads via said protection circuit and to the said internal circuits.

2. The semiconductor device according to claim 1, wherein the area where said protection circuit is formed is between, along said first direction, the areas where said internal circuits are formed, and also between, along said second direction, the areas where said internal circuits are formed.

3. The semiconductor device according to claim 1, wherein said protection circuit comprises a protection element for protection against an excessive voltage applied to said power supply pads, and points at which both ends of said protection element are connected to said power supply lines are between said power supply pads and said internal circuits.

4. The semiconductor device according to claim 1, wherein said pads are provided in the vicinity of the area for said protection circuit.

* * * * *